(12) United States Patent
Mekuria et al.

(10) Patent No.: US 6,230,123 B1
(45) Date of Patent: May 8, 2001

(54) NOISE REDUCTION METHOD AND APPARATUS

(75) Inventors: Fisseha Mekuria, Lund; Hans Cavander, Staffanstorp, both of (SE)

(73) Assignee: Telefonaktiebolaget LM Ericsson publ (SE)

( * ) Notice: Subject to any disclaimer, the term of this patent is extended or adjusted under 35 U.S.C. 154(b) by 0 days.

(21) Appl. No.: 09/205,342

(22) Filed: Dec. 3, 1998

(30) Foreign Application Priority Data

Dec. 5, 1997 (SE) .................................................. 9704552

(51) Int. Cl.[7] .................................................. G10L 21/02
(52) U.S. Cl. ........................................... 704/226; 704/228
(58) Field of Search .................................. 704/226, 200, 704/201, 228, 227, 233, 231, 500, 503

(56) References Cited

U.S. PATENT DOCUMENTS

| | | | |
|---|---|---|---|
| 4,630,304 | * 12/1986 | Borth et al. | 704/233 |
| 4,682,230 | 7/1987 | Perlman et al. | 358/167 |
| 4,761,829 | * 8/1988 | Lynk, Jr. et al. | 455/307 |
| 4,811,404 | * 3/1989 | Vilmur et al. | 704/226 |
| 5,012,519 | * 4/1991 | Aldersberg et al. | 704/226 |
| 5,323,457 | * 6/1994 | Ehara et al. | 375/346 |
| 5,485,522 | * 1/1996 | Solve et al. | 704/226 |
| 5,533,133 | 7/1996 | Lamkin et al. | 381/94 |
| 5,708,754 | * 1/1998 | Wynn | 704/226 |
| 5,710,862 | * 1/1998 | Urbanski | 704/226 |

FOREIGN PATENT DOCUMENTS

| | | | |
|---|---|---|---|
| 0459364 | 12/1991 | (EP) | G01L/3/02 |
| 0645756 | 3/1995 | (EP) | G01L/5/06 |
| 9501634 | 1/1995 | (WO) | G01L/9/00 |

OTHER PUBLICATIONS

Yang(Jim Yang, "Frequency Domain Noise Suppression Approaches in Mobile Telephone Systems," IEEE International Conference on Acoustics, Speech & Signal Processing, Apr. 1993).*
PCT International Search Report, Jun. 22, 1999.

* cited by examiner

*Primary Examiner*—Richemond Dorvil
*Assistant Examiner*—Daniel A. Nolan
(74) *Attorney, Agent, or Firm*—Jenkens & Gilchrist (57) ABSTRACT

Apparatuses for noise reduction and noise processing methods for reducing noise in audio signals are presented. The noise level of an input signal at an input terminal is measured and the noise-to-signal ratio is established. A reduced voice activity detector is used to determine whether the input signal comprises speech or not. If the measured noise level exceeds a threshold level a switch connects the input signal to means for noise reduction. However, if the measured noise level does not exceed the threshold level, i.e. when noise reduction is not needed, the switch disconnects the means for noise reduction and the input signal is passed unchanged. Power is saved by powering off the means for noise reduction when it is not needed.

19 Claims, 5 Drawing Sheets

NOISE REDUCTION METHOD AND APPARATUS

TECHNICAL FIELD OF THE INVENTION

The present invention relates to noise reduction and, in particular, to apparatuses for noise reduction, communication devices and systems comprising such apparatuses for noise reduction and to noise processing methods for reducing noise in audio signals.

DESCRIPTION OF THE PRIOR ART

A communication system for communication of speech comprises normally a microphone for picking up an acoustic signal which is supposed to include the speech to be communicated. In reality, however, not only speech but also noise which is present in the environment of the person speaking will be picked up by the microphone. Typical noisy environments are car environments, shopping malls and busy streets. It should be noted that people often use mobile communication devices, such as cellular phones, in this kind of noisy environments and, hence, the need for the implementation of an efficient noise reduction method is vital for this kind of devices.

One known form of a digital processing method for detecting and screening noise from speech in real time is presented in U.S. Pat. No. 5,012,519. The noise in an input signal is suppressed by splitting the input signal into spectral channels and decreasing the gain in each channel which has a low signal-to-noise ratio.

In U.S. Pat. No. 5,533,133 there is disclosed a method of noise suppression wherein noise is suppressed during pauses and silent periods in conversation, and voiced signals are freely passed. A voice activity detector is used to determine whether the signal comprises voice.

Whilst the known methods for noise reduction described above function quite adequately, they do have a number of disadvantages.

The implementation of the method for detecting and screening noise disclosed in U.S. Pat. No. 5,012,519 is complicated and expensive. A lot of (expensive) memory and a lot of power is needed to carry out the necessary Fast Fourier Transforms, FFTs, and the additional calculations. Memory is expensive especially in highly integrated equipment where the available chip surface is limited. Furthermore, power is always a scarce resource, especially in small battery-driven hand-held equipment such as mobile communication devices (e.g. cellular phones).

The implementation of the method of noise suppression disclosed in U.S. Pat. No. 5,533,133 is also complicated and expensive. Using a Digital Signal Processor, DSP, to implement the voice activity detector requires a lot of (expensive) memory and a lot of power to carry out all necessary calculations. Memory is expensive especially in highly integrated equipment where the available chip surface is limited. Furthermore, power is always a scarce resource, especially in small battery-driven hand-held equipment such as mobile communication devices (e.g. cellular phones).

It is an object of the present invention to provide apparatuses for noise reduction, communication devices and systems comprising such apparatuses for noise reduction and noise processing methods for reducing noise in audio signals which overcome or alleviate the above mentioned problems.

SUMMARY OF THE INVENTION

According to an aspect of the present invention, there is provided an apparatus for noise reduction comprising an input terminal for receiving an input signal, first switching means connected to the input terminal, noise measuring means connected to the input terminal and being arranged to measure the noise level of the input signal, first comparator means connected to the noise measuring means for receiving a measured noise level, the first comparator means being arranged to compare the measured noise level with a first pre-determined noise level and to generate a first control signal accordingly, the first comparator means being connected to the first switching means and the first switching means being controlled by the first control signal, noise reduction means connected to the first switching means and being arranged to perform noise reduction of the input signal and to provide a noise reduced output signal, when it is activated, and is bypassed or turned off, when it is deactivated, and the first control signal is arranged to control the first switching means such that the first switching means deactivates the noise reduction means when the measured noise level is lower than the first pre-determined noise level.

According to a further aspect of the present invention there is provided a mobile communication device, such as a cellular phone, comprising a microphone, a radio receiver/transmitter and an air-interface wherein the signal from the microphone is connected to an apparatus for noise reduction according to the apparatus mentioned above, the output of the apparatus for noise reduction being transmitted by means of the receiver/transmitter and the air-interface.

According to a further aspect of the present invention there is provided an accessory equipment, e.g. a hands-free equipment, for a mobile communication device, such as a cellular phone, comprising a microphone wherein the signal from the microphone is connected to an apparatus for noise reduction according to the apparatus mentioned above.

According to a further aspect of the present invention there is provided a communication system comprising a microphone and an apparatus for noise reduction according to the apparatus mentioned above.

Preferably, the noise measuring means comprises a reduced voice activity detector which does not base its decision on the pitch but on the auto-correlation and the energy contents of the input signal. This has the advantage that a small buffer memory is needed and that a small amount of power is consumed when the necessary calculations are performed.

According to a further aspect of the present invention there is provided a noise processing method for reducing noise in audio signals comprising the steps of measuring the noise level of an input signal, determining if the measured noise level is lower than a first pre-determined noise level, and providing the input signal as output signal if the measured noise level is lower than the first pre-determined noise level and, otherwise, performing noise reduction on the input signal and providing the so processed input signal as output signal.

According to a further aspect of the present invention there is provided a noise processing method for reducing noise in audio signals comprising the steps of measuring the noise level of an input signal, determining if the measured noise level is lower than a first pre-determined noise level or higher than a second pre-determined noise level, and providing the input signal as output signal if the measured noise level is lower than the first pre-determined noise level, performing noise reduction on the input signal and providing the so processed input signal as output signal if the measured noise level is higher than or equal to the first pre-determined noise level but lower than the second pre-determined noise level and, otherwise, low pass filtering the input signal and providing the so filtered input signal as output signal.

The apparatus for noise reduction, the mobile communication device, the accessory equipment for a mobile communication device and the noise processing method according to the present invention solve the problems of the prior art. Comparing with U.S. Pat. No. 5,012,519 no FFT needs to be carried out for splitting the input signal into spectral channels. Therefore, a simple implementation is achieved which requires less memory capacity and, hence, is cheaper to implement, and which consumes less power. Furthermore, comparing with U.S. Pat. No. 5,533,133 a reduced voice activity detector may be chosen instead of a conventional voice activity detector. Therefore, a simple implementation is achieved which requires less memory capacity and, hence, is cheaper to implement, and which consumes less power.

Furthermore, the present invention has the advantage that noise reduction is only carried out when needed and, thereby, power is saved when no need for carrying out noise reduction exists. The need for carrying out noise reduction is set to occur when the noise level is above a pre-determined noise threshold level. The advantage of saving power is even more pronounced when the noise reduction also is disconnected and replaced by a simple low pass filter, in the case when the noise level is high, i.e. above a second pre-determined threshold level.

It should be noted that the power consumption is always an important aspect especially in small hand-held battery-driven equipment where power is a scarce resource.

DETAILED DESCRIPTION OF EMBODIMENTS

Figure 1:
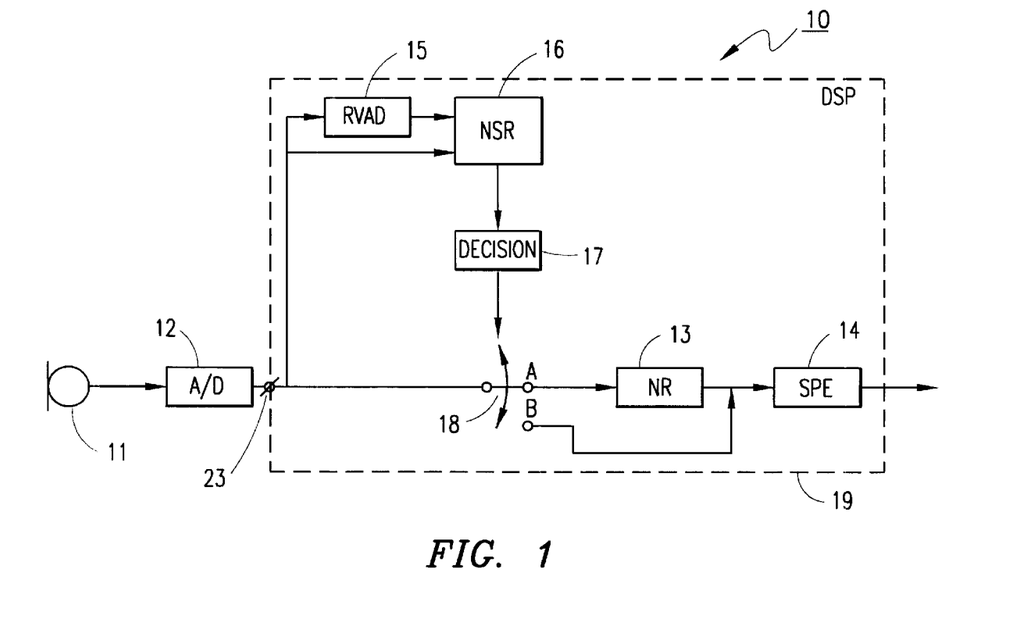
FIG. 1 is a block diagram illustrating a first embodiment of the present invention.

FIG. 1 is a block diagram 10 illustrating a first embodiment of the present invention. A microphone 11 is connected to an analogue-to-digital converter 12. The output of the analogue-to-digital converter 12 is connected to an input terminal 23. The input terminal 23 is connected to a first input of a switch 18, to an input of a reduced voice activity detector, RVAD, 15 and to a first input of a means for establishing the noise-to-signal ratio, NSR, 16. The output of the RVAD 15 is connected to a second input of the NSR 16 The output of the NSR is connected to an input of a comparator/controller means, DECISION, 17. The output of DECISION 17 is connected to a control input of the switch 18. The switch 18 is connected such that depending on the output of the DECISION 17 the input terminal 23 is either connected to a first selection terminal (selection A) which is connected to an input of a means for noise reduction, NR, 13, or to a second selection terminal (selection B) which is connected to the output of the NR 13. The output of the NR 13 is connected to a speech Encoder, SPE, 14. As is illustrated in FIG. 1 the RVAD 15, the NSR 16, the DECISION 17, the switch 18, the NR 13 and the SPE 14 are implemented by a Digital Signaling Processor, DSP, 19. The RVAD 15 and the NSR 16 constitute noise measuring means for measuring the noise level of an input signal at the input terminal 23. Furthermore, the NR 13 constitutes means for reducing the noise level of the input signal at the input terminal 23.

In operation, speech is picked up by means of the microphone 11 which provides an analogue audio signal. In reality, however, not only speech but also noise which is present in the environment of the person speaking will be picked up by the microphone 11. Typical noisy environments are car environments, shopping malls and busy streets. It should be noted that people often use mobile communication devices, such as cellular phones, in this kind of noisy environments and, hence, the need for the implementation of an efficient noise reduction method is vital for these kind of devices. The analogue audio signal is converted into a digital signal by means of the analogue-to-digital converter 12. The digital signal will appear as an input signal at the input terminal 23. It should be understood that the analogue-to-digital converter 12 is illustrated schematically and includes the conventional pre-filtering means (e.g. low pass filter) and sample-and-hold means. The sequence of digital values appearing on the input terminal as an input signal may be labeled $z(n)$ where n indicates the n:th sample.

The noise level of the input signal at the input terminal 23 is measured, as described below, by means of the RVAD 15 and the NSR 16. The comparator/controller means DECISION 17 compares the measured noise level with a first pre-determined noise level, NL1. If the noise level of the input signal is lower than the first pre-determined noise level the switch 18 is controlled such that the means for reducing the noise level of the input signal, NR, 13 is deactivated. In this case the input signal at the input terminal 23 is connected by means of the switch 18 directly to the input of the SPE 14 and, hence, bypasses the NR 13. This corresponds to selection B of the switch 18. The fact that the NR is deactivated means that it can be powered off to save power. When the NR is implemented as a software routine of a DSP 19, as indicated in FIG. 1, this means that this software routine is not running. If the noise level of the input signal is higher than or equal to the first pre-determined noise level, NL1, the switch 18 is controlled such that the means for reducing the noise level of the input signal, NR, 13 is activated. In this case the input signal at the input terminal 23 is processed by the NR and the so processed noise reduced signal constitutes the output signal of the apparatus for noise reduction. This corresponds to selection A of the switch 18. In the embodiment shown in FIG. 1 this output signal is afforded to the SPE 14 where it is further processed.

In the following the operation of the noise measuring means for measuring the noise level of an input signal at the input terminal 23 is described. First of all the reduced voice activity detector, RVAD, 15 is used to establish whether a voice signal is present or not at the input terminal 23.

It should be noted that a conventional voice activity detector, VAD, may be used instead of a reduced voice activity detector. Such a conventional VAD is known, for example, from the ETSI standard for GSM (No. 06.32), the method and implementation of which are hereby incorporated by reference.

Figure 3:
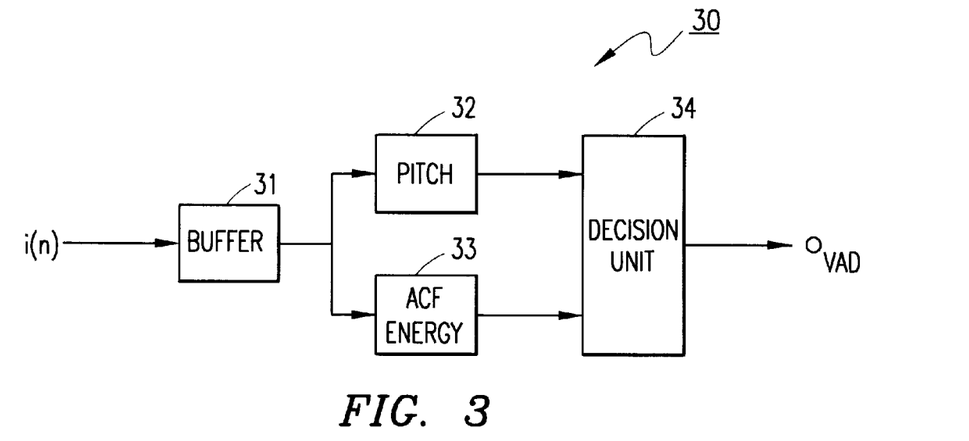
FIG. 3 is a block diagram illustrating a conventional voice activity detector.

FIG. 3 is a block diagram illustrating a conventional voice activity detector, generally designated by reference number 30. A buffer memory, BUFFER, 31 having an input for receiving a sampled signal i(n) is provided. The output of the buffer memory 31 is connected to the input of a pitch detector, PITCH, 32 and to the input of a combined auto-correlation function detector, ACF, and energy detector, ENERGY, 33. The output of the pitch detector 32 and the output of the auto-correlation function detector and the energy detector 33 are connected to inputs of a decision unit, DECISION UNIT, 34. The output signal of the decision unit 34 is labeled $o_{VAD}$. In operation a sequence of sampled signals (sampled at times n) are stored in the buffer memory 31. A controller (not shown) provides the stored signals to the pitch detector 32 which determines the basic pitch of the provided signals. At the same time the stored signals are provided to the auto-correlation function detector and the energy detector 33 which determines the auto-correlation function and the energy contents of the provided signals. The auto-correlation function detector, ACF, and the energy detector, ENERGY, are shown in a common box 33 in FIG. 3 because the square of the provided signal needs to be determined both by the auto-correlation function detector and the energy detector. The decision unit 34 makes use of the output of the pitch detector 32 and the auto-correlation function detector and the energy detector 33 to provide an output signal $o_{VAD}$. The output signal $o_{VAD}$ adopts either a first state (e.g. binary "1") or a second state (e.g. binary "0") depending on whether the decision unit 34 has established that speech is present or not.

The decision unit 34 operates according to the basic idea that when speech is present the pitch detector succeeds in determining a basic pitch and, at the same time, the energy contents of the provided signal is comparatively high. On the other hand, when no speech is present the pitch detector has difficulties in determining a basic pitch, the auto-correlation is close to zero and the energy contents is comparatively low.

A problem with the conventional VAD is that it requires a large buffer memory and a lot of computing power to determine the pitch of the signal. Assuming that a signal has been sampled with 8000 samples/second with 13 bits of resolution and that the pitch detector needs one second to determine the pitch, then the buffer memory needs to store 104000 bits. Furthermore, the pitch detector consumes a lot of power when it carries out the calculations needed. It is therefore advantageous to use a reduced voice activity detector, RVAD, which dispenses with the pitch information.

Figure 4:
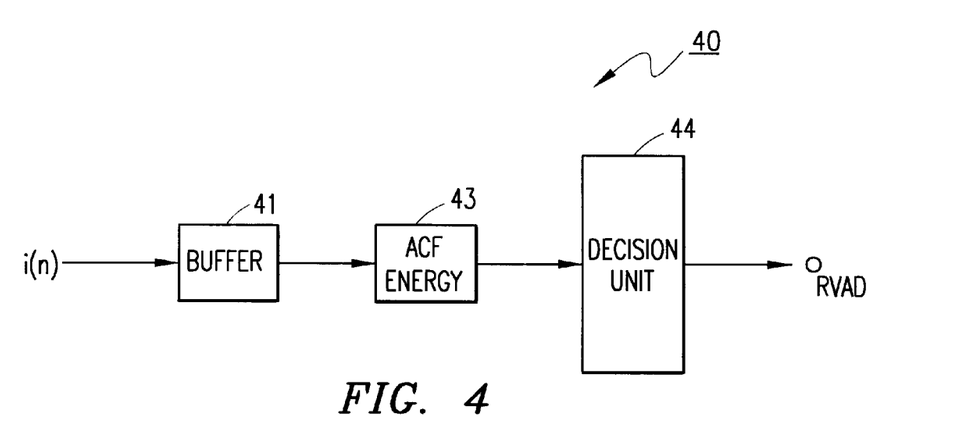
FIG. 4 is a block diagram illustrating a reduced voice activity detector.

FIG. 4 is a block diagram illustrating a reduced voice activity detector, generally designated by reference number 40. A buffer memory, BUFFER, 41 having an input for receiving a sampled signal i(n) is provided. The output of the buffer memory 41 is connected to the input of an auto-correlation function detector, ACF, and an energy detector, ENERGY, 43. The output of the auto-correlation function detector and the energy detector 43 is connected to a decision unit, DECISION UNIT, 44. The output signal of the decision unit 44 is labeled $o_{RVAD}$. In operation a sequence of sampled signals (sampled at times n) are stored in the buffer memory 41. A controller (not shown) provides the stored signals to the auto-correlation function detector and the energy detector 43 which determine the auto-correlation function and the energy contents of the provided signals. The decision unit 44 makes use of the output of the auto-correlation function detector and the energy detector 43 to provide an output signal $o_{RVAD}$. The output signal $o_{RVAD}$ adopts either a first state (e.g. binary "1") or a second state (e.g. binary "0") depending on whether the decision unit 44 has established that speech is present or not.

The decision unit 44 operates according to the basic idea that when speech is present the auto-correlation is not close to zero and the energy contents of the provided signal is comparatively high. On the other hand, when no speech is present the auto-correlation is close to zero and the energy contents is comparatively low.

It should be noted that the size of the buffer memory 41 of the RVAD in FIG. 4 does not need to be as large as the buffer memory 31 of the VAD in FIG. 3. The reason for this is that the buffer memory 41 of the RVAD does only need to store a sufficient number of samples to determine the auto-correlation function and the energy contents of the provided signal. The buffer memory 41 of the VAD, however, also needs to store the large amount of samples required to allow the pitch of the provided signal to be determined. Furthermore, the RVAD consumes far less power than the VAD because the power consumed by the pitch detector to calculate the pitch of the provided signal is substantial.

Returning to FIG. 1, the output from the RVAD 15 (or if a VAD is used, the output of the VAD) comprises the binary information whether speech is present or not in the input signal z(n) at the input terminal 23. In the case when the RVAD 15 indicates that speech is present the input signal z(n) is labeled x(n) and in the case when the RVAD 15 indicates that speech is not present the input signal z(n) is labeled v(n). The noise-to-signal ratio, R, is then calculated by the NSR 16 according to the algorithm:

$$R = \frac{\frac{1}{N} \cdot \sum_{n=1}^{N} v(n)}{\frac{1}{N} \cdot \sum_{n=1}^{N} x(n)}$$

where N is a pre-determined number of samples. It should be noted that x(n) is set equal to zero if no voice is present at sample n and v(n) is set equal to zero if voice is present at sample n. The noise-to-signal ratio, R, is forwarded to the comparator/controller means, DECISION, 17, where R is compared with a first pre-determined noise level, NL1. The switch 18 is controlled in accordance with the description above depending on whether R is lower than NL1 or not.

Figure 2:
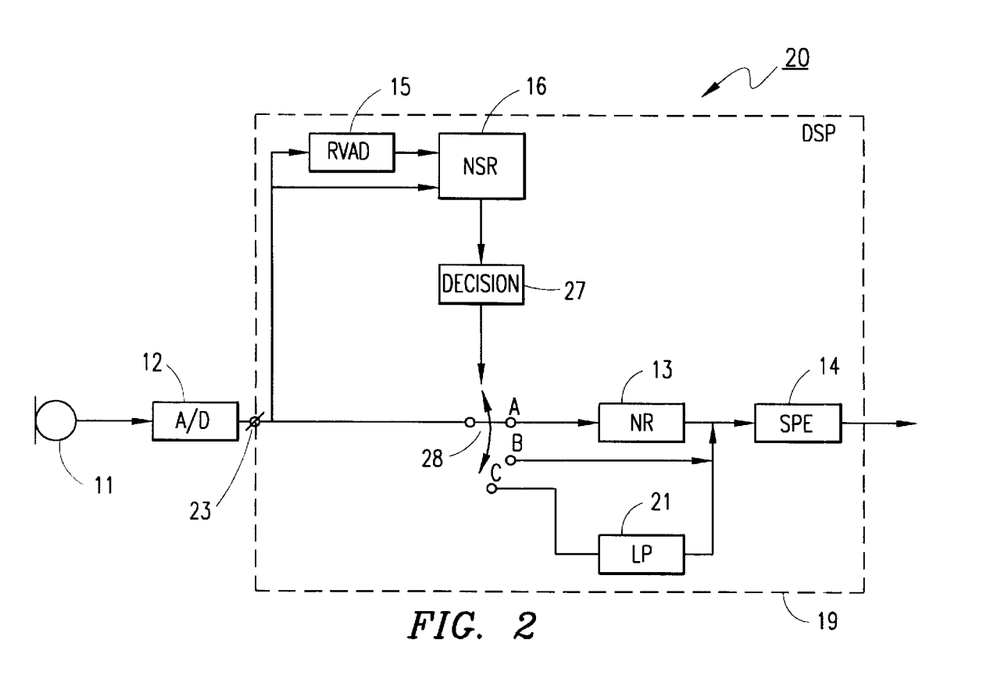
FIG. 2 is a block diagram illustrating a second embodiment of the present invention.

FIG. 2 is a block diagram 20 illustrating a second embodiment of the present invention. The second embodiment is similar to the first embodiment and corresponding elements have been indicated by the same reference symbols and numbers. The second embodiment differs from the first embodiment in that the switch 18 is substituted by a switch 28 having an additional third selection terminal. Furthermore, the comparator/controller DECISION 17 is substituted by a comparator/controller DECISION 27 which compares the measured noise level with the first pre-determined noise level, NL1, and a second pre-determined noise level, NL2. The DECISION 27 generates a control signal which adopts a unique status depending on if the measured noise level is lower than the first pre-determined noise level, NL1, or if the measured noise level is higher than or equal to the first pre-determined noise level, NL1, but lower than or equal to the second pre-determined noise level, NL2, or if the measured noise level is higher than the second pre-determined noise level, NL2. The output of DECISION 27 is connected to a control input of the switch 28. The switch 28 is connected such that depending on the status of the control signal from the DECISION 27 the input terminal 23 is either connected to the first selection terminal (selection A) which is connected to the input of the means for noise reduction, NR, 13, or to a second selection terminal (selection B) which is connected to the output of the NR 13 or to a third selection terminal (selection C) which is connected to an input of a low pass filter, LP, 21. The second embodiment further differs from the first embodiment in that the input of the low pass filter 21 is connected to the third selection terminal of the switch 28 and the output of the low pass filter 21 is connected to the output of the NR 13. As is illustrated in FIG. 2 the low pass filter is implemented by the Digital Signal Processor 19. It should be understood that the switch 28 may be implemented by means of a first switching means corresponding to the switch 18 of the first embodiment and a second switching means corresponding to a switch allowing the low pass filter 21 to be connected between the input terminal 23 and the output of the NR 13. Furthermore, the LP 21 constitutes a filtering means for filtering the input signal at the input terminal.

In operation, speech is picked up by means of the microphone 11 and converted into a digital signal in the same manner as discussed above in conjunction with the first embodiment.

The noise level of the input signal at the input terminal 23 is measured, as described above, by means of the RVAD 15 and the NSR 16. The DECISION 27 compares the measured noise level with the first pre-determined noise level, NL1, and with the second pre-determined noise level, NL2. If the noise level of the input signal is lower than a first pre-determined noise level, NL1, the switch 28 is controlled such that the means for reducing the noise level of the input signal, NR, 13 is deactivated. In this case the input signal at the input terminal 23 is connected by means of the switch 28 directly to the input of the SPE 14 and, hence, bypasses the NR 13. This corresponds to selection B of the switch 28. The fact that the NR is deactivated means that it can be powered off to save power. When the NR is implemented as a software routine of a DSP 19, as indicated in FIG. 2, this means that this software routine is not running. If the noise level of the input signal is higher than or equal to the first pre-determined noise level, NL1, but lower than or equal to a second pre-determined noise level, NL2, the switch 28 is controlled such that the means for reducing the noise level of the input signal, NR, 13 is activated. In this case the input signal at the input terminal 23 is processed by the NR and the so processed noise reduced signal constitutes the output signal of the apparatus for noise reduction. This corresponds to selection A of the switch 28. If the noise level of the input signal is higher than the second pre-determined noise level, NL2, the switch 28 is controlled such that the low pass filter, LP, 21 is activated. In this case the input signal at the input terminal 23 is processed by the LP and the so filtered signal constitutes the output signal of the apparatus for noise reduction. At the same time the NR 13 is deactivated. This corresponds to selection C of the switch 28. Again, the fact that the NR is deactivated means that it can be powered off to save power. The idea is that at high noise levels it is assumed that a (simple) low pass filter will perform at least almost as well as a (complex) noise reduction algorithm of the NR. By powering off the NR and instead using the less power consuming low pass filter the overall power consumption is decreased in this case. It should be understood that the LP 21 can be deactivated and, hence, powered off by means of the switch 28 when the noise level of the input signal is lower than or equal to the second pre-determined noise level, NL2. In the embodiment shown in FIG. 2 this output signal is afforded to the SPE 14 where it is further processed.

The noise measuring means for measuring the noise level of an input signal at the input terminal 23 operates in the same manner as discussed above in conjunction with the first embodiment. The only difference is that the noise-to-signal ratio, R, which is forwarded to the comparator/controller means, DECISION, 27, is compared by DECISION 27 with a first pre-determined noise level, NL1, and to a second pre-determined noise level, NL2. The switch 28 is controlled in accordance with the description above depending on whether R is lower than NL1, higher than or equal to NL1 but lower than or equal to NL2, or higher than NL2.

Figure 5:
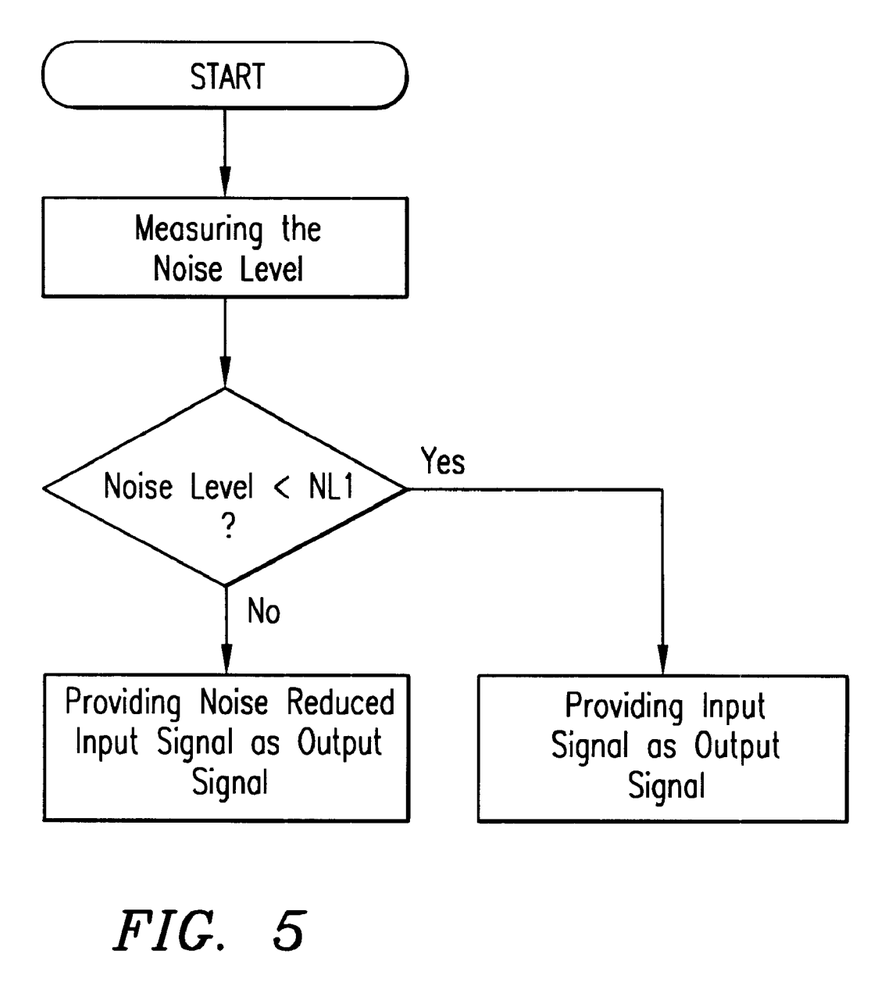
FIG. 5 is a flow diagram illustrating a first method of operation of the present invention.

FIG. 5 is a flow diagram illustrating a first method of operation of the present invention. This method corresponds to the method of operation as discussed in conjunction with the first embodiment above. First the noise level of an input signal is measured. Next, the measured noise level is compared with a pre-determined noise level NL1. If the measured noise level is lower than the pre-determined noise level the input signal is provided as the output signal. Otherwise, the noise of the input signal is reduced, for example by an appropriate noise reduction algorithm, and the so noise reduced signal is provided as the output signal.

Figure 6:
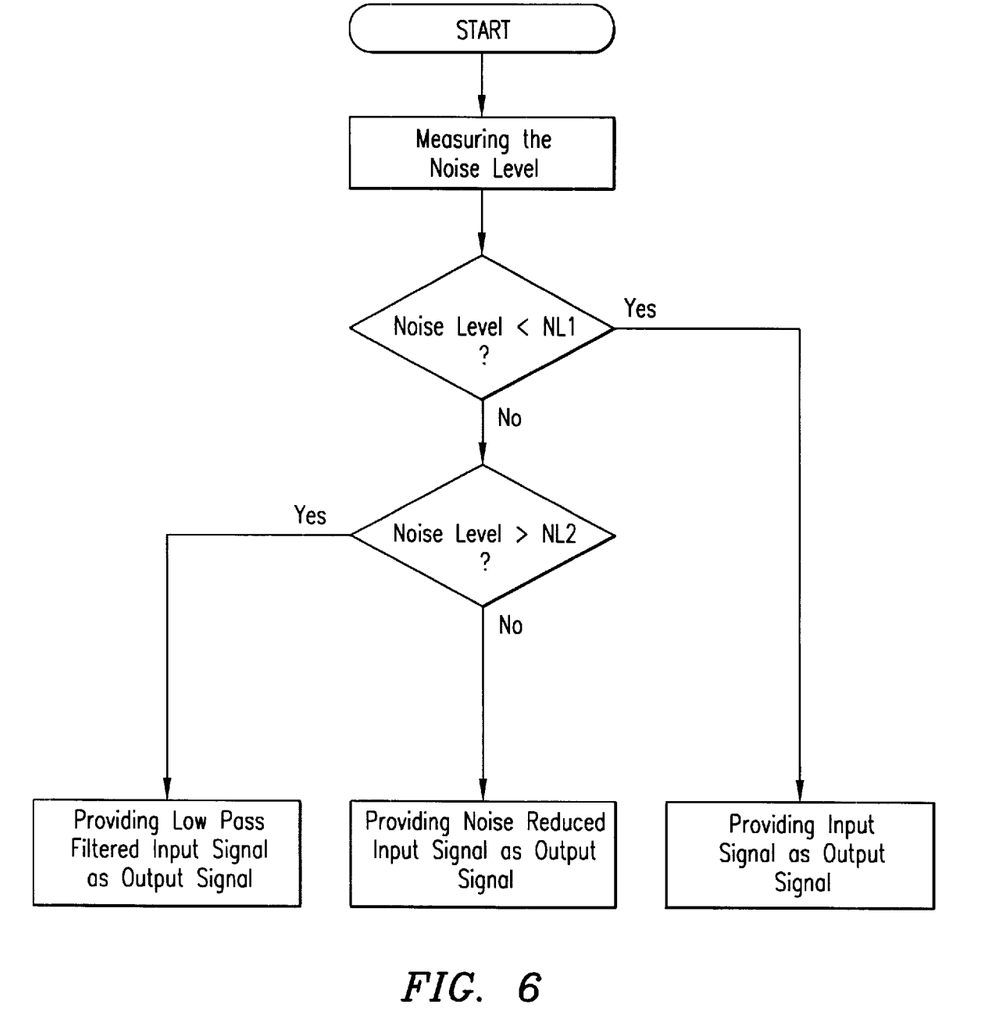
FIG. 6 is a flow diagram illustrating a second method of operation of the present invention.

FIG. 6 is a flow diagram illustrating a second method of operation of the present invention. This method corresponds to the method of operation as discussed in conjunction with the second embodiment above. First the noise level of an input signal is measured. Next, the measured noise level is compared with a first pre-determined noise level, NL1. If the measured noise level is lower than the first pre-determined noise level the input signal is provided as the output signal. If the measured noise level is higher than or equal to the first pre-determined noise level the measured noise level is compared with a second pre-determined noise level, NL2. If the measured noise level is higher than the second pre-determined noise level the input signal is filtered by a low pass filter, and the so filtered signal is provided as the output signal. Otherwise, the noise of the input signal is reduced, for example by an appropriate noise reduction algorithm, and the so noise reduced signal is provided as the output signal.

The apparatus for noise reduction and the noise processing method are especially useful in communication systems (not shown) and mobile communication devices (not shown), such as cellular phones. The communication system or the mobile communication device comprises a microphone, a radio receiver/transmitter and an airinterface. By connecting the signal from the microphone to the apparatus for noise reduction and the output of the apparatus for noise reduction to the receiver/transmitter the noise processing method of the present invention is carried out on the signal from the microphone before the signal is transmitted by means of the receiver/transmitter and the air-interface.

In the case when a hands-free equipment for mobile communication devices, such as cellular phones, is used the apparatus for noise reduction and the noise processing method of the present invention can preferably be implemented within the hands-free equipment. The output signal from the hands-free equipment to the mobile communication device will then have been processed according to the noise processing method of the present invention before it enters the mobile communication device.

It should be understood that the man skilled in the art may alternate the features of the disclosed embodiments and using well-known equivalents without departing from the present invention. For example, although the embodiments shown make use of a Digital Signal Processor for the implementation of the present invention the invention is in no way limited to this kind of implementation. Instead, the complete structure or parts thereof may be implemented by hardware.

What is claimed is:

1. An apparatus for reducing noise comprising:
an input terminal for receiving an input signal;
a noise measurer connected to the input terminal and operable to measure a noise level of the input signal;
a comparator for receiving the measured noise level from the noise measurer and operable to generate a first control signal by comparing the measured noise level with a first predetermined noise level;
a switch connected to the input terminal and controlled by the first control signal generated by the comparator; and
a noise reducer connected to the switch and operable to reduce noise within the input signal when said noise reducer is activated by the switch, wherein said first control signal is operable to control the switch so as to activate the noise reducer when the measured noise level is higher than the first predetermined noise level, and said first control signal is operable to control the switch so as to deactivate the noise reducer when the measured noise level is lower than the first predetermined noise level.

2. The apparatus of claim 1, further comprising an analog-to-digital converter for digitizing said input signal.

3. The apparatus of claim 2, wherein said noise measurer includes a voice activity detector and means for establishing a noise-to-signal ratio corresponding to the measured noise level.

4. The apparatus of claim 3, wherein said noise-to-signal ratio is calculated according to:

$$R = \frac{\frac{1}{N} \cdot \sum_{n=1}^{N} v(n)}{\frac{1}{N} \cdot \sum_{n=1}^{N} x(n)}$$

where R is the noise-to-signal ratio, v(n) is the input signal at sample n when said voice activity detector does not detect voice, x(n) is the input signal at sample n when said voice activity detector detects voice and N is a predetermined number of samples.

5. The apparatus of claim 3, wherein said voice activity detector includes a reduced voice activity detector including an auto-correlation function detector and an energy detector.

6. The apparatus of claim 1, wherein said noise measurer, said comparator, said switch and said noise reducer are implemented by a digital signal processor.

7. The apparatus of claim 1, wherein said comparator is further operable to generate a second control signal by comparing the measured noise level with a second predetermined noise level higher than said first predetermined noise level; and
said switch is further controlled by said second control signal generated by the comparator; and wherein said apparatus further comprises:
a filter connected to the switch and operable to filter noise within the input signal when said filter is activated by the switch, wherein said second control signal is operable to control the switch so as to activate the filter when the measured noise level is higher than the second predetermined noise level during which the noise reducer is also deactivated even when the measured noise level is higher than the first predetermined noise level.

8. The apparatus of claim 7, wherein said filter includes a low pass filter.

9. The apparatus of claim 1, wherein said apparatus is implemented within a mobile communication device.

10. The apparatus of claim 1, wherein said apparatus is implemented within a communications system.

11. A noise processing method for reducing noise comprising the steps of:
measuring a noise level of an input signal;
determining if the measured noise level is lower than a first predetermined noise level; and
providing the input signal as an output signal when the measured noise level is lower than said first predetermined noise level and, otherwise, performing noise reduction on the input signal and providing the so processed input signal as the output signal.

12. The noise processing method of claim 11 further including the step of deactivating the noise reduction when the measured noise level is lower than said first predetermined noise level.

13. The noise processing method of claim 11 further including the step of digitizing the input signal.

14. The noise processing method of claim 11 further including the step of establishing a noise-to-signal ratio corresponding to the measured noise level.

15. A noise processing method for reducing noise comprising the steps of:
measuring a noise level of an input signal;
determining if the measured noise level is lower than a first predetermined noise level or higher than a second predetermined noise level, said second predetermined noise level being higher than said first predetermined noise level; and
providing the input signal as an output signal when the measured noise level is lower than said first predetermined noise level and, otherwise, performing noise reduction on the input signal and providing the so processed input signal as the output signal when the measured noise level is higher than or equal to said first predetermined noise level but lower than said second predetermined noise level and, otherwise, performing low pass filtering on said input signal and providing the so filtered input signal as the output signal when the measured noise level is higher than or equal to said second predetermined noise level.

16. The noise processing method of claim 15 further including the step of deactivating the noise reduction when the measured noise level is lower than said first predetermined noise level and higher than said second predetermined noise level.

17. The noise processing method of claim 15 further including the step of deactivating the low pass filtering when the measured noise level is lower than said second predetermined noise level.

18. The noise processing method of claim 15 further including the step of digitizing the input signal.

19. The noise processing method of claim 15 further including the step of establishing a noise-to-signal ratio corresponding to the measured noise level.

* * * * *